United States Patent
Choueiry et al.

(10) Patent No.: US 8,055,203 B2
(45) Date of Patent: Nov. 8, 2011

(54) MULTIPOINT VOLTAGE AND CURRENT PROBE SYSTEM

(75) Inventors: Ray Choueiry, Rochester, NY (US);
Todd Heckleman, Spencerport, NY (US); David J. Coumou, Webster, NY (US)

(73) Assignee: MKS Instruments, Inc., Andover, MA (US)

( * ) Notice: Subject to any disclaimer, the term of this patent is extended or adjusted under 35 U.S.C. 154(b) by 890 days.

(21) Appl. No.: 11/763,298

(22) Filed: Jun. 14, 2007

(65) Prior Publication Data

US 2008/0227420 A1 Sep. 18, 2008

Related U.S. Application Data

(60) Provisional application No. 60/894,738, filed on Mar. 14, 2007.

(51) Int. Cl.
*H04B 17/00* (2006.01)
*H01J 7/24* (2006.01)

(52) U.S. Cl. ............... 455/67.11; 45/67.11; 45/226.1; 315/111.21

(58) Field of Classification Search ............ 455/41.1, 455/67.11–67.12, 226.1, 226.2, 115.1, 115.3, 455/127.1–127.4; 315/111.21
See application file for complete search history.

(56) References Cited

U.S. PATENT DOCUMENTS

| | | | |
|---|---|---|---|
| 5,486,832 A | 1/1996 | Hulderman | |
| 5,770,922 A | 6/1998 | Gerrish et al. | |
| 5,939,886 A | 8/1999 | Turner et al. | |
| 6,265,831 B1 * | 7/2001 | Howald et al. | 315/111.21 |
| 6,447,636 B1 * | 9/2002 | Qian et al. | 156/345.48 |
| 6,449,568 B1 | 9/2002 | Gerrish | |
| 6,522,121 B2 * | 2/2003 | Coumou | 324/76.19 |
| 6,608,446 B1 | 8/2003 | Coumou | |
| 6,707,255 B2 * | 3/2004 | Coumou et al. | 315/111.41 |
| 6,708,123 B2 | 3/2004 | Gerrish | |
| 6,720,866 B1 * | 4/2004 | Sorrells et al. | 340/10.4 |
| 6,902,646 B2 * | 6/2005 | Mahoney et al. | 156/345.24 |
| 7,421,321 B2 * | 9/2008 | Breed et al. | 701/29 |
| 2002/0185227 A1 * | 12/2002 | MacGearailt | 156/345.43 |
| 2004/0007326 A1 | 1/2004 | Roche et al. | |
| 2004/0065539 A1 | 4/2004 | Sosnowski | |
| 2005/0067386 A1 * | 3/2005 | Mitrovic | 219/121.43 |

(Continued)

FOREIGN PATENT DOCUMENTS

EP 1244133 A1 9/2002

(Continued)

OTHER PUBLICATIONS

Office Action for Japanese Patent Application No. 2007-317737 dated Apr. 12, 2011.

(Continued)

*Primary Examiner* — Simon Nguyen
(74) *Attorney, Agent, or Firm* — Harness, Dickey & Pierce, P.L.C.

(57) ABSTRACT

A metrology system monitors radio frequency (RF) power at a plurality of locations in a circuit. The system includes a plurality of RF sensors that generate respective analog signals based on electrical properties of the RF power, a multiplexing module that generates an output signal based on the analog signals, and an analysis module that generates messages based on the output signal. The messages contain information regarding the electrical properties that are sensed by the plurality of RF sensors.

27 Claims, 10 Drawing Sheets

U.S. PATENT DOCUMENTS

| | | | |
|---|---|---|---|
| 2005/0227625 A1* | 10/2005 | Diener | 455/67.7 |
| 2005/0273218 A1 | 12/2005 | Breed et al. | |
| 2006/0128311 A1* | 6/2006 | Tesfai | 455/67.11 |
| 2006/0232471 A1 | 10/2006 | Coumou | |
| 2006/0239389 A1 | 10/2006 | Coumou | |
| 2006/0249729 A1 | 11/2006 | Mundt et al. | |
| 2006/0262889 A1* | 11/2006 | Kalvaitis et al. | 375/355 |
| 2007/0024362 A1* | 2/2007 | Radomski et al. | 330/123 |

FOREIGN PATENT DOCUMENTS

| | | |
|---|---|---|
| JP | 3078809 A | 4/1991 |
| JP | 2001-516946 T | 10/2001 |
| JP | 2002-530856 T | 9/2002 |
| JP | 2004205328 A | 7/2004 |
| JP | 2005121651 A | 5/2005 |
| JP | 2006140440 A | 6/2006 |
| JP | 2006-304585 A | 11/2006 |
| WO | 2004/008502 A2 | 1/2004 |

OTHER PUBLICATIONS

European Search Report for European Application No. 07253937.2 dated Jun. 7, 2010.

Office Action for Taiwanese Application No. 096134945 dated Jun. 30, 2011.

* cited by examiner

MULTIPOINT VOLTAGE AND CURRENT PROBE SYSTEM

CROSS-REFERENCE TO RELATED APPLICATIONS

This application claims the benefit of U.S. Provisional Application No. 60/894,738, filed on Mar. 14, 2007. The disclosure of the above application is incorporated herein by reference in its entirety.

FIELD

The present disclosure relates to metrology for sensing radio frequency power in plasma processing systems.

BACKGROUND

The statements in this section merely provide background information related to the present disclosure and may not constitute prior art.

The electronics industry uses radio frequency (RF) plasma to fabricate various components such as integrated circuits, compact disks (CDs), digital versatile discs (DVDs), and the like. Generally the RF plasma process is monitored and controlled by a closed loop control system.

RF plasma control systems measure one or more parameters of RF power that is applied to a plasma chamber. A plasma controller repeatedly adjusts the parameters based on the measurements and a control algorithm. In multipoint applications the measurements are taken at more than one location in the RF power path and it can be challenging to synchronize or time-correlate the measurements from the various locations.

The communications industry also uses RF energy to allow devices and people to wirelessly communicate and pass information between different locations. Radio communication sites may include radio transmitters, receivers, antennas, and the like. They may also include test and/or monitoring equipment to ensure that the radio communication sites are functioning properly and in accordance with government regulations and/or industry standards.

The test and/or monitoring equipment can measure RF system parameters at more than one location in the RF path of a particular station. While the parameters may be used to ensure the system is functioning properly, it can be challenging to synchronize or time-correlate the parameter measurements from the various locations.

SUMMARY

A metrology system is disclosed for monitoring radio frequency (RF) power at a plurality of locations in a circuit. The system includes a plurality of RF sensors that generate respective analog signals based on electrical properties of the RF power, a multiplexing module that generates an output signal based on the analog signals, and an analysis module that generates messages based on the output signal. The messages contain information regarding the electrical properties that are sensed by the plurality of RF sensors.

A metrology system is disclosed for monitoring radio frequency (RF) power at a plurality of locations in a circuit. The system includes a plurality of sense channels that each generate an output signal based on an electrical property of the RF power at one of the locations in the circuit. Each sense channel includes a RF sensor that generates a first signal based on the electrical property of the RF power, an oscillator that generates a periodic signal, and a mixer that mixes the first signal with the periodic signal to generate the output signal for the sense channel. A RF combiner generates a second output signal based on the plurality of output signals from the sense channels.

A metrology system is disclosed for monitoring radio frequency (RF) power at a plurality of locations in a circuit. The system includes a plurality of sense channels that each generate a pair of output signals based on electrical properties of the RF power at one of the locations in the circuit. Each sense channel includes a RF sensor that generates a pair of analog signals based on the RF power, an oscillator that generates first and second periodic signals that are out-of-phase, a first mixer that mixes the first periodic signal with one of the analog signals to generate one of the output signals of the sense channel, and a second mixer that mixes the second periodic signal with the other one of the analog signals to generate a second one of the output signals of the sense channel. A first RF combiner generates a first broadband signal based on the plurality of output signals from the first mixers and a second RF combiner generates a second broadband signal based on the plurality of output signals from the second mixers.

A metrology system is disclosed for monitoring radio frequency (RF) power at a plurality of locations in a circuit. The system includes a plurality of RF sensors that each generates a pair of analog signals based on electrical properties of the RF power at one of the locations in the circuit, a first multiplexer that receives one of the analog signals from each pair of analog signals and routes one of the received signals to an output of the first multiplexer in accordance with a control signal, a second multiplexer that receives the other one of the analog signals from each pair of analog signals and routes one of the received signals to an output of the second multiplexer in accordance with the control signal, and an analysis module that generates messages based on the signals from the output of the first and second multiplexers. The messages contain information regarding the electrical properties that are sensed by the plurality of sense channels.

A method is disclosed for monitoring radio frequency (RF) power at a plurality of locations in a circuit. The method includes generating an output signal based on an electrical property of the RF power at an associated one of the locations in the circuit, each generating step including generating a first signal based on the RF power, generating a periodic signal, and mixing the first signal with the periodic signal to generate the output signal. The method includes combining the output signals to generate a broadband signal that includes frequency components of each of the output signals.

A method is disclosed for monitoring radio frequency (RF) power at a plurality of locations in a circuit. The method includes generating a pair of analog signals based on electrical properties of the RF power at an associated one of the locations in the circuit, multiplexing one signal of the pair of analog signals to a first output signal, multiplexing the other one of the signals of the pair of analog signals to a second output signal, and generating messages based on the signals from the first and second output signals of the multiplexing steps. The messages contain information regarding the electrical properties that are sensed by the plurality of sense channels.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

Figure 5:
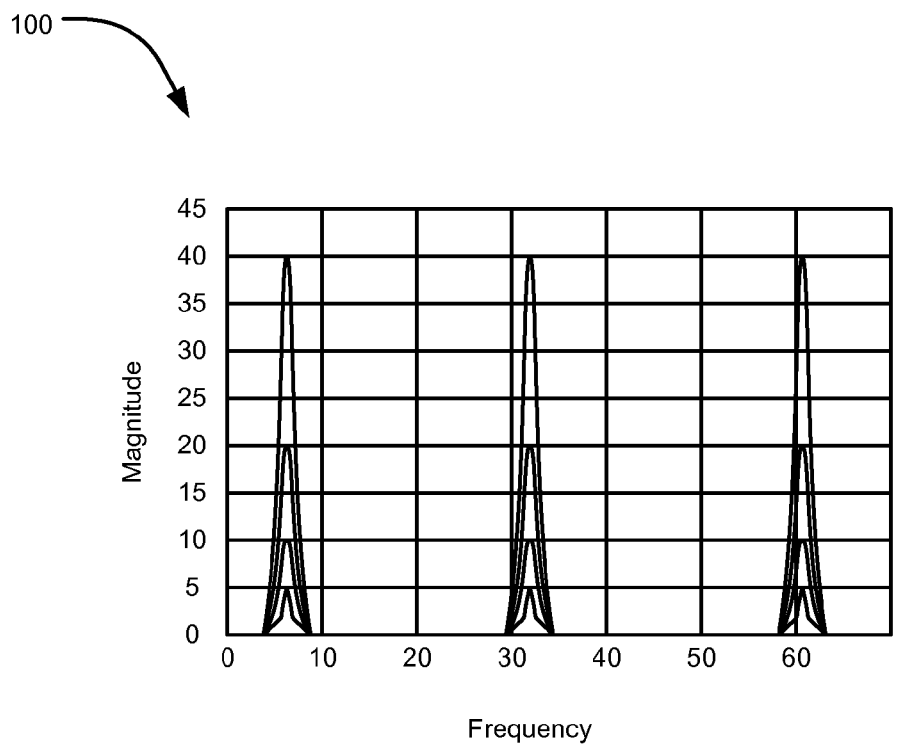
Figure 6:
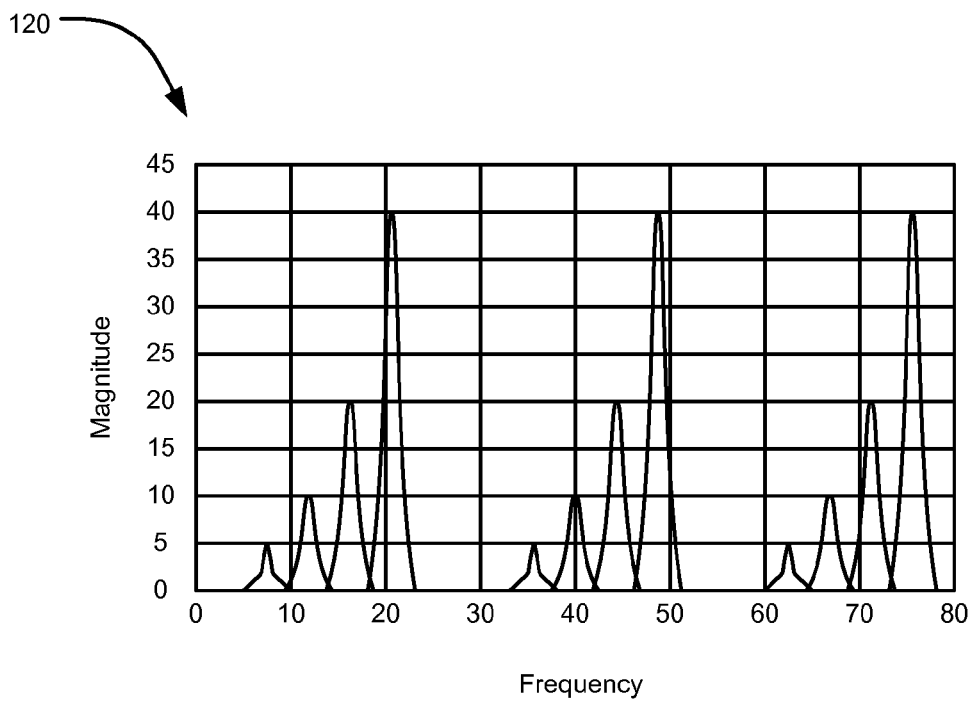
Figure 7:
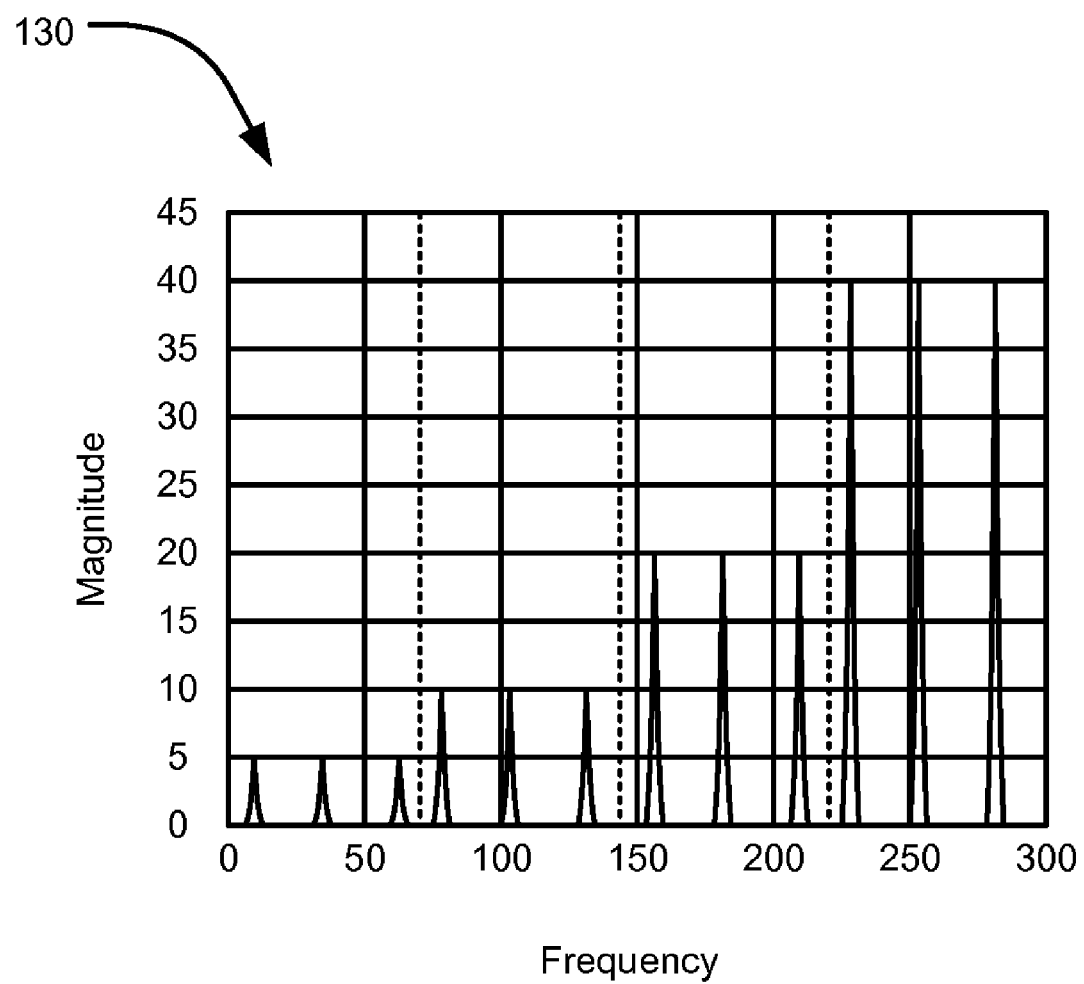
Figure 8:
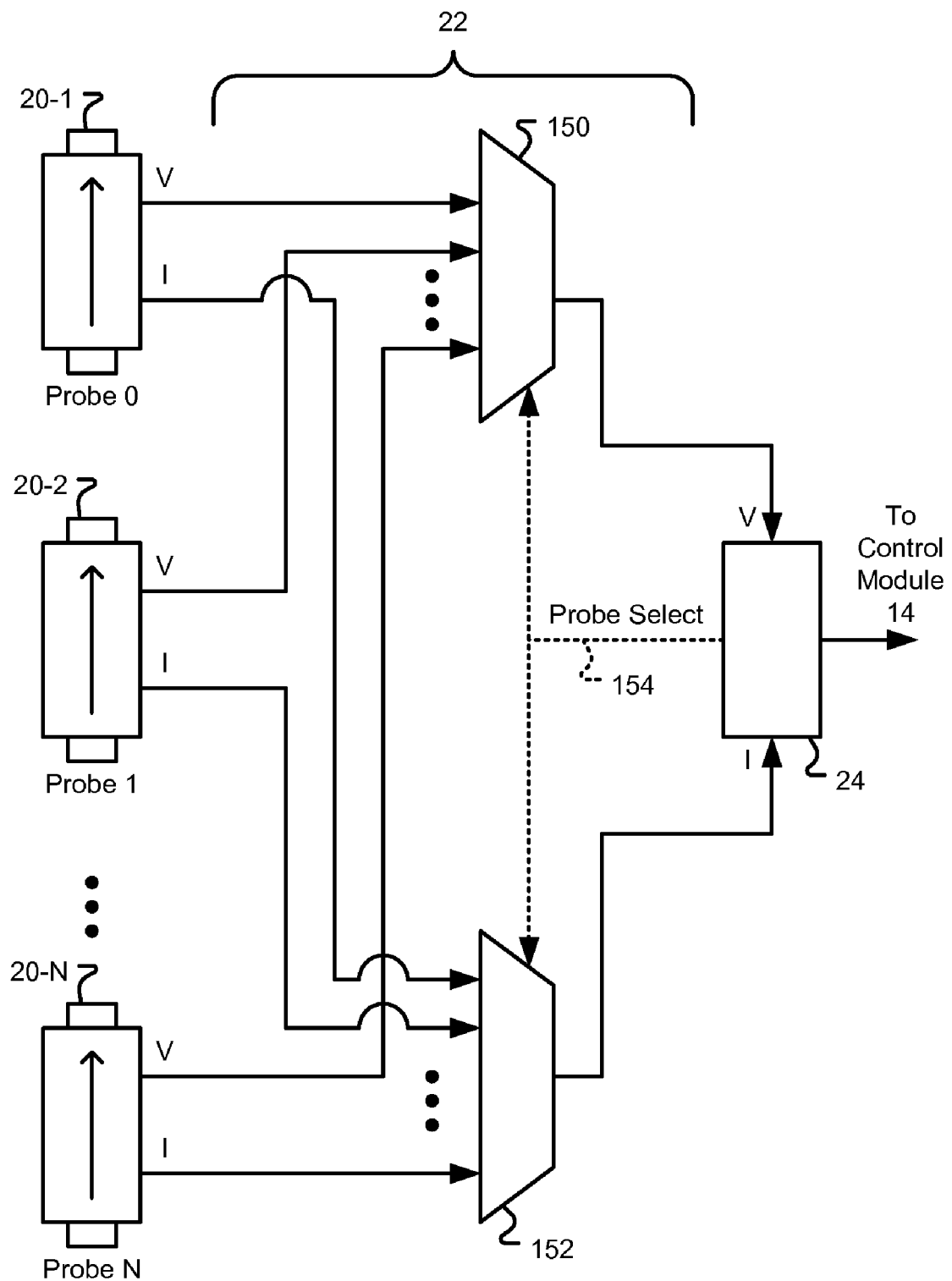
Figure 9:
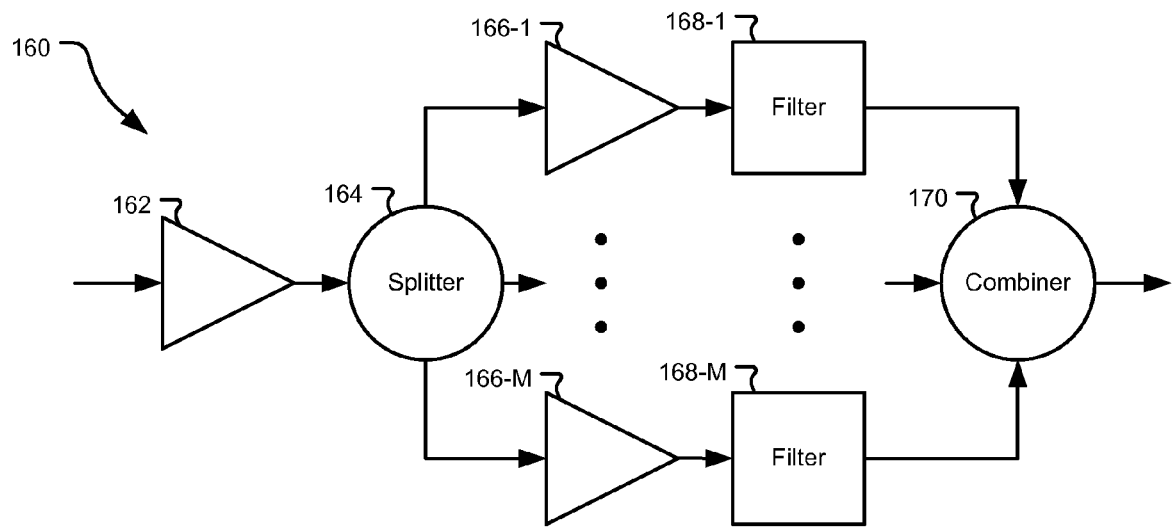
Figure 11:
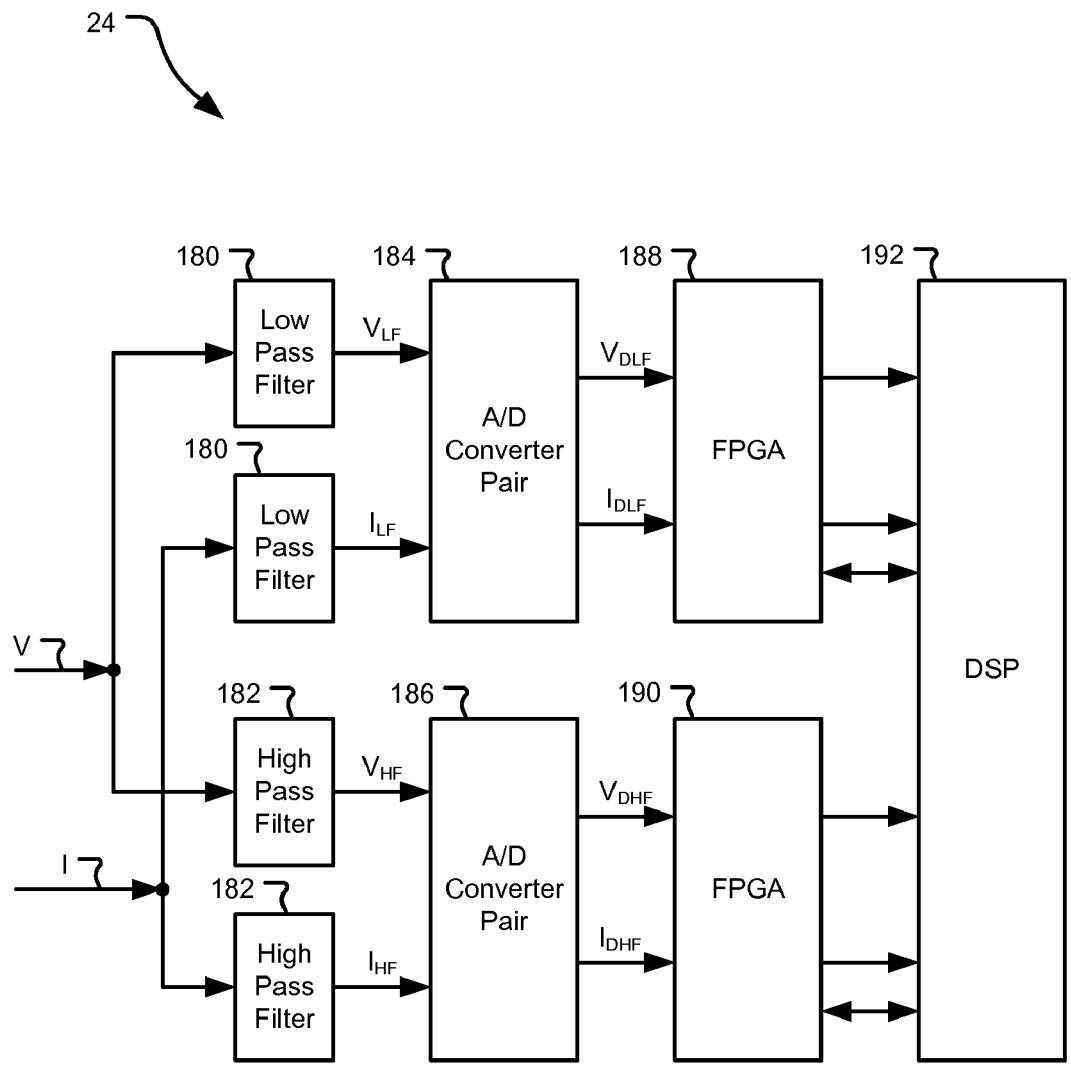

FIG. 5. is a spectral diagram of the frequency components of a RF signal derived from the linear combination of measurements at a plurality of locations;

FIG. 6. is a spectral diagram of the frequency components of FIG. 5 after low frequency mixing;

FIG. 7. is a spectral diagram of the frequency components of FIG. 5 after high frequency mixing;

FIG. 8 is a functional block diagram of a time multiplexed multipoint probe;

FIG. 9 is a functional block diagram of a signal conditioning and partitioning module;

FIGS. 10A-10D are spectral diagrams of various signals in the partitioning module of FIG. 9;

FIG. 11 is a functional block diagram of an analysis module; and

Figure 12:
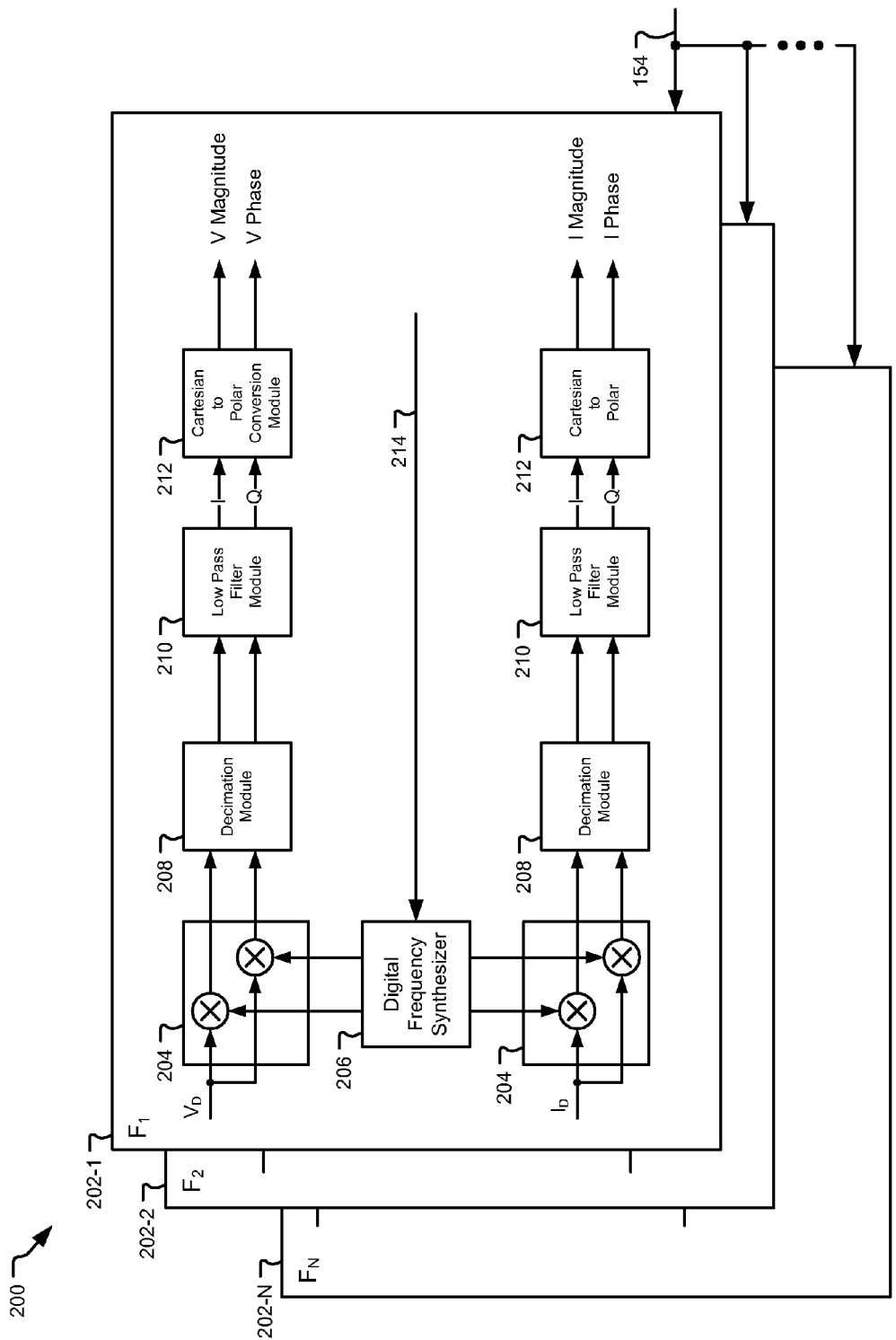

FIG. 12 is a functional block diagram of conversion modules that can be employed with the time multiplexed multipoint probe of FIG. 8.

DETAILED DESCRIPTION

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 1:
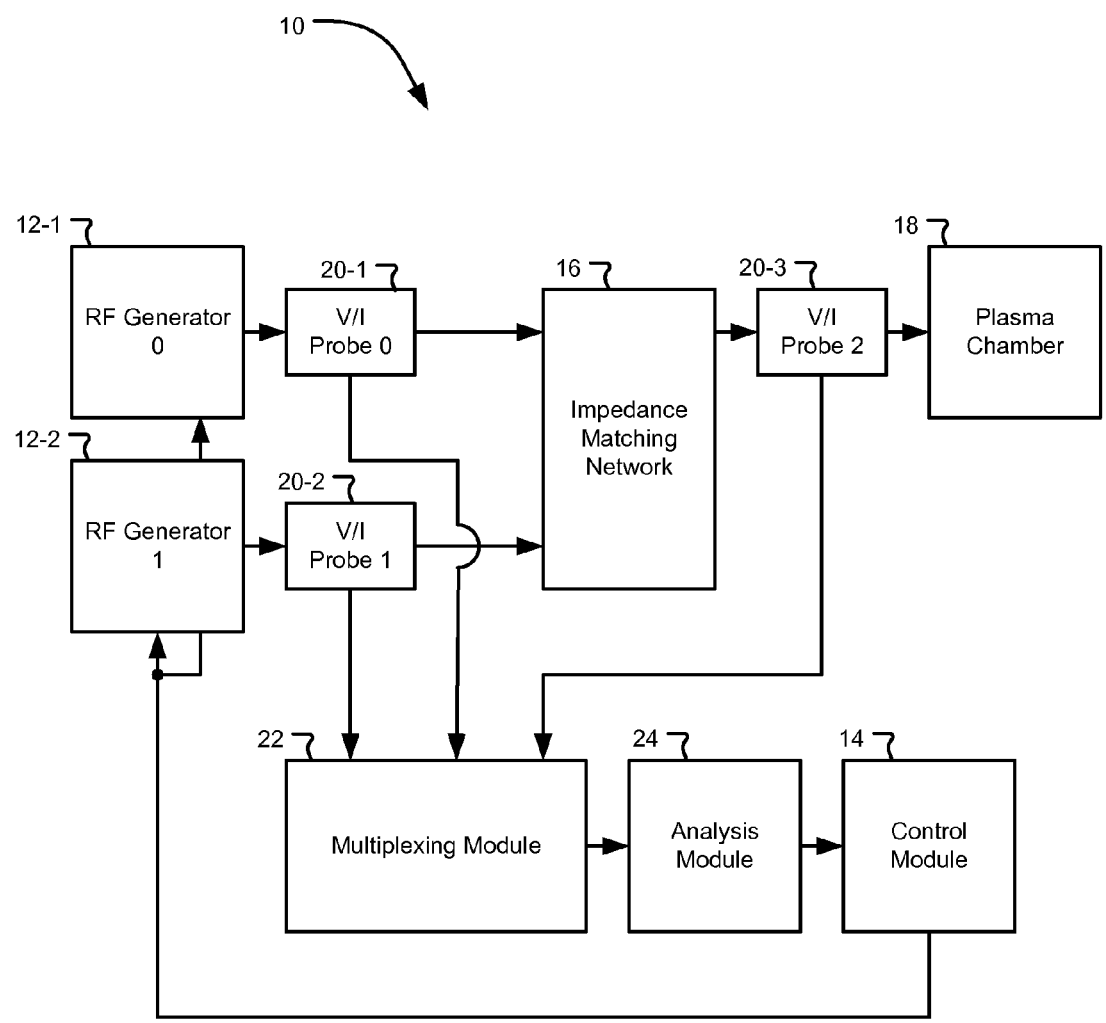
FIG. 1 is a functional block diagram of a RF plasma generator that includes multipoint RF sensors.

Referring now to FIG. 1, one of several embodiments is shown of an RF plasma generator 10. RF plasma generator 10 includes a multiplexing module 22 that facilitates measuring RF power at a plurality of locations within RF plasma generator 10. Multiplexing module 22 is described below in more detail.

RF plasma generator 10 includes RF generators 12-1 and 12-2, collectively referred to as RF generators 12. A control module 14 generates control signals for RF generators 12. The control signals determine electrical parameters, such as voltage, current, power, and the like, of the RF power at the outputs of RF generators 12. The outputs of RF generators 12 communicate with respective inputs of an impedance matching network 16. Impedance matching network 16 matches an input impedance of a plasma chamber 18 to an output impedance of RF generators 12, which is typically 50 ohms.

RF plasma generator 10 includes a plurality of sensors or probes 20 that sense one or more parameters of the RF power at the various locations. First and second probes 20-1 and 20-2 sense the RF power at the outputs of respective ones of RF generators 12. A third probe 20-3 senses the RF power between the output of impedance matching network 16 and the input of plasma chamber 18. Each probe 20 generates one or more signals that represent the electrical parameter or parameters of interest. For example, probes 20 can be directional couplers when the parameters of interest are forward and/or reflected power. Probes 20 can be voltage/current (V/I) probes when the parameters of interest are voltage and/or current.

The signals from probes 20 communicate with inputs of multiplexing module 22. Multiplexing module 22 shifts the frequency of and/or samples the signals and communicates the results of the frequency shift and/or sampling to an analysis module 24. Analysis module 24 generates data based on the results. The data quantifies the parameters of interest as sensed by respective ones of probes 20. Analysis module 24 generates one or more digital and or analog signals that communicate the data and/or information to control module 14. Control module 14 then adjusts the control signals based on the data and a control algorithm.

Figure 2:
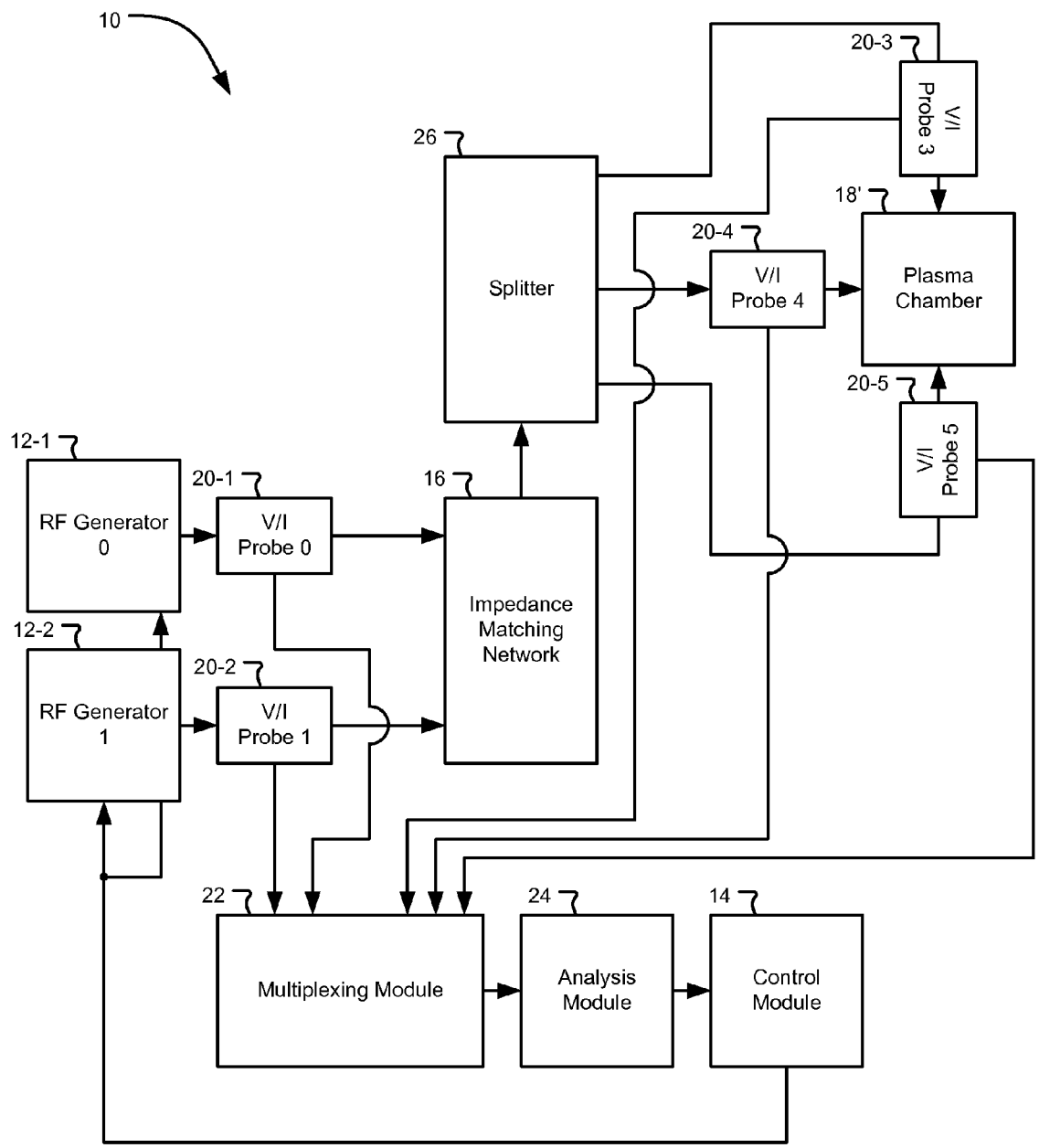
FIG. 2 is a functional block diagram of a plasma generator that includes multiple RF sources and multipoint RF sensors.

Referring now to FIG. 2, RF plasma generator 10 is shown with a multiple shower head plasma chamber 18'. The RF power at the output of impedance matching network 16 communicates with an input of a splitter 26. Splitter 26 divides or splits the RF power to the plurality of inputs of plasma chamber 18'. Probes 20-3, 20-4, and 20-5 sense the RF power that is applied to respective ones of the inputs of plasma chamber 18'. Multiplexing module 22 receives and processes the signals from additional probes 20-4 and 20-5 and includes their information in the signal or signals communicated to analysis module 24.

Figure 3:
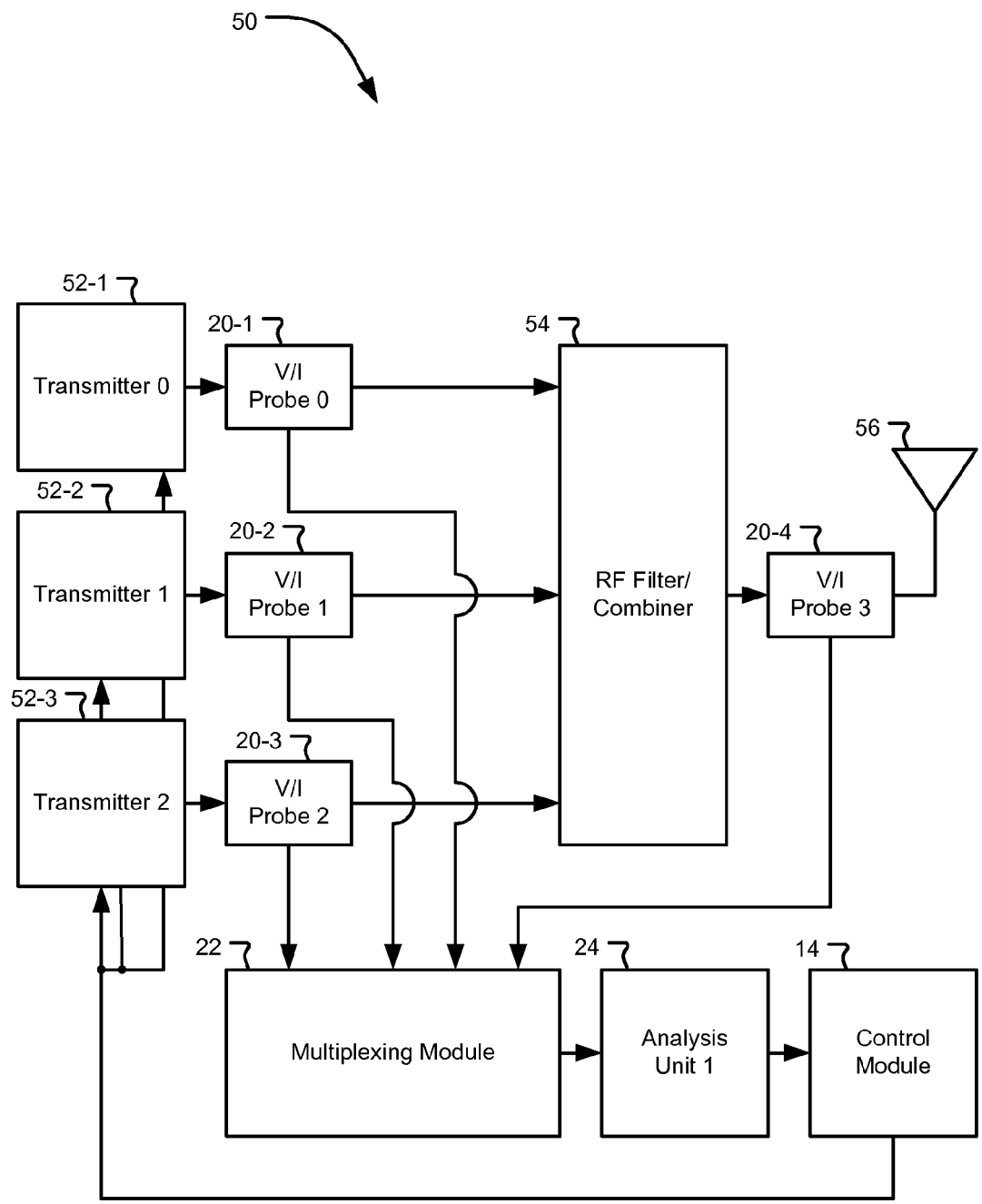
FIG. 3 is a functional block diagram of a wireless RF transmitter that includes multipoint RF sensors.

Referring now to FIG. 3, one of several embodiments is shown of a wireless RF transmitter 50. Wireless RF transmitter 50 employs multiplexing module 22 and a plurality of probes 20 that sense the RF power at various locations within wireless RF transmitter 50.

Wireless RF transmitter 50 includes a plurality of RF generators or transmitters 52-1, 52-2, and 52-3 that generate RF signals. The RF signals communicate with respective inputs of a RF filter/combiner 54. RF filter/combiner 54 passes the fundamental frequency of the RF signals and combines them to form a composite output RF signal. The composite output RF signal communicates with an input of an antenna 56.

Probes 20-1, . . . , 20-4 sense the RF power at their respective locations. Multiplexing module 22 receives and processes the signals from probes 20-1, . . . , 20-4. Multiplexing module 22 combines and/or samples the signals and communicates the results of the combination and/or sampling to analysis module 24. Analysis module 24 generates data based on the results. The data quantifies the parameters of interest as sensed by respective ones of probes 20. Analysis module 24 communicates the data to control module 14. Control module 14 then adjusts control signals based on the data and a control algorithm. The control signals feed back to RF transmitters 52 and vary one or more parameters of their respective RF power outputs.

Figure 4:
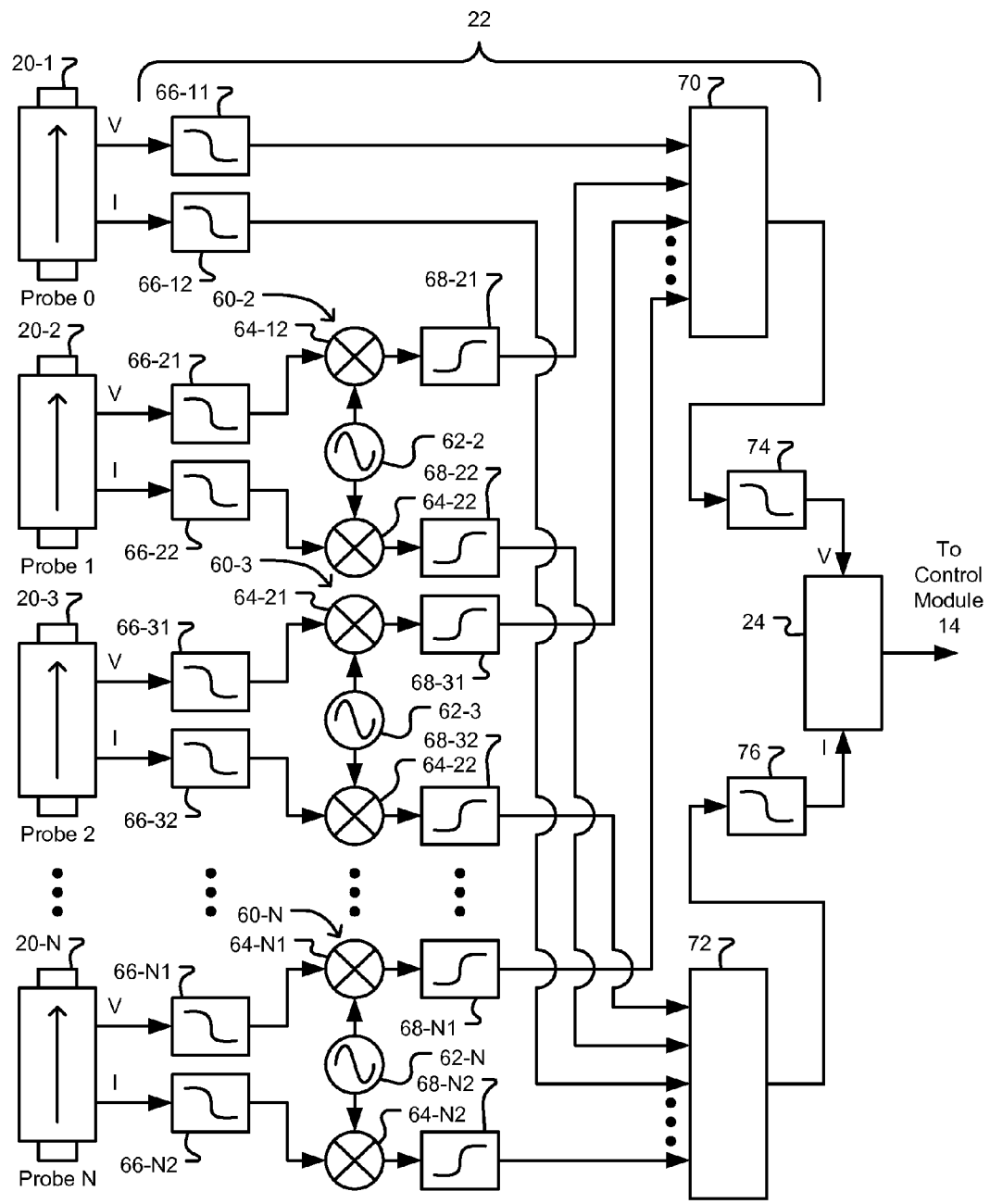
FIG. 4 is a functional block diagram of a frequency multiplexed module for multipoint RF sensors.

Referring now to FIG. 4, one of several embodiments is shown of the frequency-division version of multiplexing module 22. FIG. 4 shows probes 20 as V/I probes that generate signals that represent the voltage and current of the RF power at the respective probe. It should be appreciated that probes 20 may in some embodiments be implemented as directional couplers that generate signals that represent the forward and reflected powers of the RF power at the respective probe. Probes 20 may also be any other type of probe that generates signals based on selected electrical properties of interest.

In some embodiments probes 20 may down convert the frequency of the sensed signal. An example of such probes 20 is shown in U.S. Pat. No. 5,770,922, which is hereby included by reference in its entirety.

Multiplexing module 22 includes a plurality of mixing modules 60-2, . . . , 60-N that receive the signals from respective ones of probes 20. Each mixing module 60 includes a respective local oscillator 62 and pair of mixers 64. Each pair of mixers 64 receives respective in-phase and out-of-phase, e.g. sine and cosine, signals from their associated local oscillator 62. Each of local oscillators 62 may have a different frequency from the others. The frequencies of local oscillators 62 can be less than or greater than a first signal frequency of the signals from probes 20. In some embodiments, such as when the frequencies of the signals from probes 20 are different, local oscillators 62 can use a common frequency. The signals from first probe 20-1 may remain at their fundamental frequency and do not need to pass through a mixing module 60. The signals from probes 20 may pass through respective low-pass filters 66. The signals from mixers 64-2 may pass through respective high pass filters 68.

A first RF combiner 70 receives the signals from the first mixers 64 in each of mixing modules 60. A second RF combiner 72 receives the signals from the second mixers 64 in each mixing modules 60. Outputs of RF combiners 70 and 72 communicate with the inputs of control module 14. In some embodiments the outputs of RF combiners 70 and 72 may pass through respective low-pass filters 74 and 76 before they communicate with the inputs of control module 14.

It should be appreciated that one or more of filters 66, 68, 74 and 76 may include an associated scaling module. Gains of the scaling modules may be adjusted so that amplitudes of the signals of interest are matched with the dynamic range of the inputs to analysis module 24.

Mixing modules 60 shift the signals from respective probes 20 in the frequency domain before the signals are applied to analysis module 24. Mixing modules 60 thereby allow analysis module 24 to simultaneously receive information from all probes 20. Analysis module 24 should have an input bandwidth that accommodates desired portions of the frequency spectrums of the signals, filtered or unfiltered, at the outputs of mixers 64 and probe 20-1. Such analysis modules 24 are presently manufactured by MKS Instruments with part numbers VIP2001, VIP2007, and VIP2009. U.S. Pat. Nos. 6,522,121 and 6,707,255 are included herein by reference in their entirety and also provide examples of analysis modules 24 that are compatible with the frequency-division version of multiplexing module 22.

Referring now to FIG. 5, a spectral diagram 100 shows, by way of non-limiting example, frequency components of the analog signals from four probes 20 prior to being applied to respective mixing modules 60. Spectral diagram 100 shows that the frequency components of the signals from probes 20 lie on top of each other. If these signals were applied directly to analysis module 24 (e.g. without passing through mixing modules 60) then analysis module 24 would not be able to discern which signals are associated with which probes 20.

Referring now to FIG. 6, a spectral diagram 120 shows frequency components of the signals at the outputs of four mixing modules 60. Spectral diagram 120 assumes that the frequencies of local oscillators 62 are less than the fundamental frequency of the signals from probes 20. Each set of signals at a particular magnitude is associated with one of probes 20. Spectral diagram 120 shows that mixing modules 60 shift the fundamental frequencies of the signals from probes 20 to manage overlap of the frequency components each signal. Mixing modules 60 thereby enable analysis module 24 to discern which frequency components are associated with a particular probe 20. The frequency shifts of the signals from each probe 20 vary in accordance with the frequency of the associated local oscillator 62 and, in some embodiments, are equal to +/− the frequency of the associated local oscillator 62. It should be appreciated by those skilled in the art that when filters 66, 68, 74, and/or 76 are used they remove some of the frequency components from the signals that are generated by probes 20.

Referring now to FIG. 7, a spectral diagram 130 shows frequency components of the signals at the outputs of four mixing modules 60. Spectral diagram 130 assumes that the frequencies of local oscillators 62 are greater than the fundamental frequency of the signals from probes 20. Each set of signals at a particular magnitude is associated with one of probes 20. Spectral diagram 130 shows that mixing modules 60 shift the fundamental frequencies of the signals from probes 20 to manage the overlap of frequency components of each signal. The frequency components of each probe 20 are grouped together within a corresponding frequency band. The grouped frequencies enable analysis module 24 to discern which frequency components are associated with a particular probe 20. The frequency shifts of the signals from each probe 20 vary in accordance with the frequency of the associated local oscillator 62 and, in some embodiments, are equal to +/− the frequency of the associated local oscillator 62. It should be appreciated by those skilled in the art that when filters 66, 68, 74, and/or 76 are used they remove some of the frequency components from the signals that are generated by probes 20.

Referring now to FIG. 8, one of several embodiments is shown of the time-division version of multiplexing module 22. The time-division multiplexing module 22 allows the full frequency spectrum from one of probes 20 to reach analysis module 24 at any selected time. A first multiplexer 150 includes a plurality of inputs that receives one of the analog signals from each of probes 20. A second multiplexer 152 includes a plurality of inputs that receive the second analog signals from each of probes 20. Each of multiplexers 150 and 152 include an input that receives a probe select signal 154. Probe select signal 154 determines which probe 20 has its signals routed to the outputs of multiplexers 150 and 152 at the selected time.

Referring now to FIG. 9, a signal conditioning and partitioning module 160 is shown. One or more signal conditioning and partitioning modules 160 are employed when multiplexing module 22 of FIG. 8 is employed with multiple RF generators 12, such as shown in FIGS. 1-3. RF generators 12 employ different fundamental frequencies. The fundamental frequencies can be combined in at least one of impedance matching network 16 and RF filter/combiner 54. Signal conditioning and partitioning module 160 matches the bandwidth and gain of the RF signal from a respective one of probes 20 with dynamic range of analysis module 24.

Each signal conditioning and partitioning module 160 receives the signal from a respective output of one of probes 20. A scaling module 162 amplifies or attenuates the signal before it reaches an input of a 1-to-M splitter 164, where M is a number of frequency bands. Each output of 1-to-M splitter 164 provides a duplicate of the signal that is applied to the input. Each of the M outputs communicates with a respective one of M scaling modules 166. Each scaling module 166 can have a gain that is less than, equal to, or greater than unity. The outputs of scaling modules 166 communicate with respective inputs of filters 168. Passbands of filters 168 may be selected based on frequencies of interest to the user. A combiner 170 combines output signals from filters 168. An output of combiner 170 provides a filtered sensor signal that is communicated to a respective input of multiplexer 150 or multiplexer 152. The gains of scaling modules 162 and 166 and the cutoff frequencies and bandwidths of filters 168 may be selected based on the M different frequency bands and to maximize quantization of the RF signal by analysis module 24. Each filter 168 may be implemented as an all pass, a low pass, a high pass, or a band pass filter.

Figure 10A:
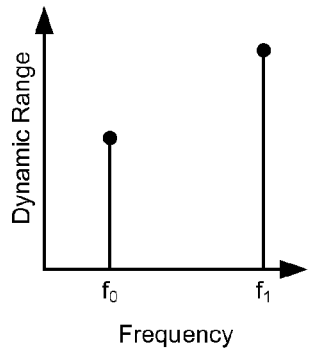

Referring now to FIGS. 10A-10D, unscaled spectral diagrams show an example of frequency components at various points in signal conditioning and partitioning module 160. It should be appreciated that the spectral diagrams assume RF generators 12 are providing two fundamental frequencies, i.e. M=2, that are centered at $f_0$ and $f_1$. FIG. 10A shows a spectral diagram at the input of scaling module 162. It can be seen that the amplitudes of $f_0$ and $f_1$ can be unequal and not necessarily matched to an input characteristic or limitation of analysis module 24.

Figure 10B:
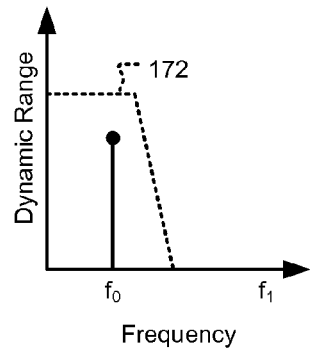

FIG. 10B shows the spectral diagram at the output of filter 168-1. FIG. 10B assumes that filter 168-1 is implemented as a low-pass filter with a cutoff frequency greater than $f_0$ and less than $f_1$. A passband of filter 168-1 is shown at 172.

Figure 10C:
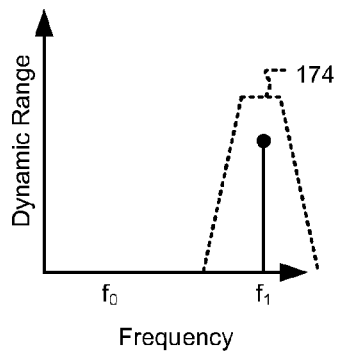
Figure 10D:
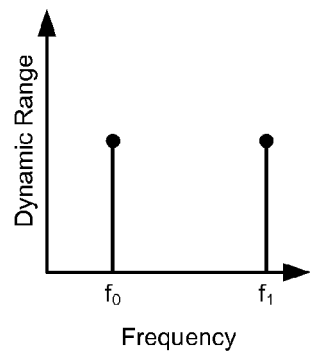

FIG. 10C shows the spectral diagram at the output of filter 168-M. FIG. 10C assumes that filter 168-M is implemented as a bandpass filter with a center frequency at $f_1$ and a lower cutoff frequency greater than $f_0$. A passband of filter 168-M is shown at 174. FIG. 10C also assumes that the gain of scaling module 166-M is less than unity, thereby reducing the amplitude of $f_1$ prior to entering combiner 170. FIG. 10D shows the spectral diagram at the output of combiner 170.

Referring now to FIG. 11, a functional block diagram is shown of one of various architectures of analysis module 24 that may be employed with the time-division version of multiplexing module 22 (FIG. 8). The inputs V and I each receive a signal from a respective signal conditioning and partitioning module 160. Each input signal is applied to a respective low pass filter 180 and a respective high pass filter 182. In some embodiments filters 180 and 182 may be omitted and the filtering function be satisfied by filters 168.

A first pair of analog-to-digital (A/D) converters 184 convert low frequency components of the respective V and I signals from filters 180. A second pair of A/D converters 186 convert high frequency components of the respective V and I signals from filters 182. A/D converter pair 184 communicates the converted signals to a field programmable gate array (FPGA) 188. A/D converter pair 186 communicates the converted signals to a field programmable gate array (FPGA) 190. Each FPGA 188 and 190 converts its respective digitized voltage and current data into in-phase (I) and quadrature (Q) signals. A digital signal processor (DSP) 192 quantifies parameters of interest based on the I and Q signals from FPGAs 188 and 190.

Referring now to FIG. 12, a block diagram 200 shows functionality that is provided by FPGA 188 and DSP 192. It should be appreciated by those skilled in the art that the functions shown in block diagram 200 may also be provided by other means at a user's discretion.

Block diagram 200 includes N conversion modules 202-1, . . . , 202-N, which are collectively referred to as conversion modules 202. Each conversion module 202 is associated with one of probes 20 and receives the converted data from one of A/D converter pairs 184 and 186. Probe select signal 154 (also shown in FIG. 8) activates the conversion module 202 that is associated with the selected one of probes 20.

Each conversion module 202 includes a pair of mixing modules 204. Mixing modules 204 receive digital signals acquired from the associated one of A/D converter pairs 184, 186. Each mixing module 204 also receives two inputs from a digital frequency synthesizer 206. In general, digital frequency synthesizer 206 generates digital mixing signals. In particular, digital frequency synthesizer 206 produces sine and cosine waveforms that correspond with one or more of the frequencies of interest from the associated signal conditioning and partitioning module 160. A frequency set point signal 214 establishes the operating frequency of digital frequency synthesizer 206. For each conversion module 202, the frequency set point signal can be switched through a plurality of setpoints to process a plurality of the frequencies of interest for a particular probe 20. In one embodiment, the frequency setpoints are a frequency offset received from frequency sources that drives the RF generators 12 or transmitters 52.

Each digital mixing module 204 combines digital mixing signals received from digital frequency synthesizer 206 with the conversion data received from the associated A/D converter pair. To do so, each digital mixing module 204 includes two digital multipliers. In addition, digital mixing modules 204 operate at the sample rate of the associated A/D converter pair. The result from each digital mixing module 204 is a spectrum constructed from the sum and difference of the frequencies contained in the digitized data and the signals provided by the digital frequency synthesizer.

Outputs of mixer modules 204 communicate with inputs of respective decimation modules 208. Decimation modules 208 translate the sample rate to a lower or baseband data rate. By way of non-limiting example, decimation is described in U.S. Pat. No. 6,707,255, which is hereby incorporated by reference in its entirety.

In some embodiments, mixing modules 204 and decimation modules 208 are implemented with FPGAs 188 and 190.

Outputs of decimation modules 208 communicate with inputs of respective low pass filter modules 210. Low pass filter modules 210 shape the spectral output of decimation modules 208. Outputs of low pass filter modules 210 communicate with respective Cartesian to polar conversion modules 212. Conversion modules 212 convert the filtered data from low pass filter modules 210 to a polar coordinate system.

In some embodiments, low pass filter modules 210 and Cartesian to polar conversion modules 212 are implemented with DSP 192.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

The invention claimed is:

1. A metrology system for monitoring radio frequency (RF) power at a plurality of locations in a circuit, comprising:
a plurality of sense channels that each generate an output signal based on an electrical property of the RF power at one of the locations in the circuit, each sense channel comprising:
a RF sensor that generates a first signal based on the electrical property of the RF power;
an oscillator that generates a periodic signal; and a mixer that mixes the first signal with the periodic signal to generate the output signal for the sense channel; and a RF combiner that generates a second output signal based on the plurality of output signals from the sense channels.

2. The metrology system of claim 1 further comprising:
an analysis module that generates messages based on the second output signal from the RF combiner, wherein the messages contain information regarding the electrical properties that are sensed by the plurality of sense channels.

3. The metrology system of claim 1 wherein the RF sensor is a directional coupler.

4. The metrology system of claim 1 wherein the RF sensor is a voltage/current (V/I) probe.

5. The metrology system of claim 1 further comprising a plurality of low pass filters that filter respective ones of the first signals from the RF sensors.

6. The metrology system of claim 1 further comprising a plurality of high pass filters that filter respective ones of the output signals from the sensor channels.

7. The metrology system of claim 1 further comprising a filter that filters the second output signal from the RF combiner.

8. The metrology system of claim 1 wherein each of the periodic signals has a frequency that is different from the other periodic signals.

9. The metrology system of claim 8 wherein the frequencies are evenly-spaced in the frequency domain.

10. A metrology system for monitoring radio frequency (RF) power at a plurality of locations in a circuit, comprising:
a plurality of sense channels that each generate a pair of output signals based on electrical properties of the RF power at one of the locations in the circuit, each sense channel comprising:
a RF sensor that generates a pair of analog signals based on the RF power;
an oscillator that generates first and second periodic signals that are out-of-phase;
a first mixer that mixes the first periodic signal with one of the analog signals to generate one of the output signals of the sense channel; and
a second mixer that mixes the second periodic signal with the other one of the analog signals to generate a second one of the output signals of the sense channel;
a first RF combiner that generates a first broadband signal based on the plurality of output signals from the first mixers; and
a second RF combiner that generates a second broadband signal based on the plurality of output signals from the second mixers.

11. The metrology system of claim 10 further comprising:
an analysis module that generates messages based on the broadband signals from the first and second RF combiners, wherein the messages contain information regarding the electrical properties that are sensed by the plurality of sense channels.

12. The metrology system of claim 10 wherein the RF sensors are directional couplers.

13. The metrology system of claim 10 wherein the RF sensors are voltage/current (V/I) probes.

14. The metrology system of claim 10 further comprising low pass filters that filter respective ones of the analog signals from the RF sensors.

15. The metrology system of claim 10 further comprising a plurality of high pass filters that filter respective ones of the output signals from the sensor channels.

16. The metrology system of claim 10 further comprising first and second filters that filter respective ones of the first and second broadband signals.

17. The metrology system of claim 10 wherein each of the periodic signals has a frequency that is different from the other periodic signals.

18. The metrology system of claim 17 wherein the periodic signal frequencies are evenly-spaced in the frequency domain.

19. A method for monitoring radio frequency (RF) power at a plurality of locations in a circuit, comprising:
generating an output signal based on an electrical property of the RF power at an associated one of the locations in the circuit, each generating step including:
generating a first signal based on the RF power;
generating a periodic signal; and
mixing the first signal with the periodic signal to generate the output signal; and
combining the output signals to generate a broadband signal that includes frequency components of each of the output signals.

20. The method of claim 19 further comprising generating messages based on the broadband signal, wherein the messages contain information regarding the electrical properties.

21. The method of claim 19 wherein the electrical property includes at least one of forward power and reflected power.

22. The method of claim 19 wherein the electrical property includes at least one of voltage and current.

23. The method of claim 19 further comprising filtering the first signals.

24. The method of claim 19 further comprising filtering the output signals.

25. The method of claim 19 further comprising filtering the broadband signal from the RF combiner.

26. The method of claim 19 wherein each of the periodic signals has a frequency that is different from the other periodic signals.

27. The method of claim wherein the frequencies are evenly-spaced in the frequency domain.

* * * * *

UNITED STATES PATENT AND TRADEMARK OFFICE
CERTIFICATE OF CORRECTION

PATENT NO. : 8,055,203 B2
APPLICATION NO. : 11/763298
DATED : November 8, 2011
INVENTOR(S) : Ray Choueiry et al.

Page 1 of 1

It is certified that error appears in the above-identified patent and that said Letters Patent is hereby corrected as shown below:

Column 10,
Line 51, claim 27, after "claim", insert --26--.

Signed and Sealed this
Thirteenth Day of March, 2012

David J. Kappos
*Director of the United States Patent and Trademark Office*